(12) United States Patent
Chin et al.

(10) Patent No.: US 7,161,294 B2
(45) Date of Patent: Jan. 9, 2007

(54) ORGANIC LIGHTS-EMITTING DEVICE WITH DOPED EMISSION LAYER

(75) Inventors: Byung-Doo Chin, Seongnam-si (KR);
Min-Chul Suh, Seongnam-si (KR);
Mu-Hyun Kim, Suwon-si (KR);
Nam-Choul Yang, Seoul (KR);
Seong-Taek Lee, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 63 days.

(21) Appl. No.: 10/913,532

(22) Filed: Aug. 9, 2004

(65) Prior Publication Data

US 2005/0046337 A1 Mar. 3, 2005

(30) Foreign Application Priority Data

Sep. 3, 2003 (KR) ............. 10-2003-0061591

(51) Int. Cl.
*H05B 33/00* (2006.01)
*H05B 33/14* (2006.01)

(52) U.S. Cl. .................. 313/504; 313/506; 313/503; 428/690

(58) Field of Classification Search ................ 313/504, 313/506, 503, 505, 507, 508, 509, 510, 511, 313/512; 428/212, 690, 917
See application file for complete search history.

(56) References Cited

U.S. PATENT DOCUMENTS

| 4,769,292 | A | 9/1988 | Tang et al. | |
| 6,097,147 | A | 8/2000 | Baldo et al. | |
| 6,541,909 | B1 | 4/2003 | Motomatsu | |
| 2002/0197511 | A1* | 12/2002 | D'Andrade et al. | 428/690 |
| 2003/0068525 | A1* | 4/2003 | Bellmann et al. | 428/690 |
| 2004/0263067 | A1* | 12/2004 | Saitoh et al. | 313/504 |
| 2005/0168137 | A1* | 8/2005 | Adamovich et al. | 313/504 |

FOREIGN PATENT DOCUMENTS

KR 10-2002-0030370 4/2002

* cited by examiner

*Primary Examiner*—Mariceli Santiago
*Assistant Examiner*—Anne M Hines
(74) *Attorney, Agent, or Firm*—H.C. Park & Associates PLC

(57) ABSTRACT

An OLED has a doped emission layer (EML). The OLED comprises a first electrode, a second electrode, and an EML having a host material and a light-emitting dopant and interposed between the first electrode and the second electrode, wherein the light-emitting dopant has a concentration gradient between a first surface close to the first electrode of the EML and a second surface opposite to the first surface. As a result, luminous efficiency of the OLED can be enhanced and a driving voltage can also be reduced.

13 Claims, 2 Drawing Sheets

US 7,161,294 B2

ORGANIC LIGHTS-EMITTING DEVICE WITH DOPED EMISSION LAYER

CROSS-REFERENCE TO RELATED APPLICATION

This application claims the benefit of Korea Patent Application No. 2003-61591 filed on Sep. 3, 2003, the disclosure of which is incorporated herein by reference in its entirety.

FIELD OF THE INVENTION

The present invention relates to an organic light-emitting device (hereinafter, referred to as OLED) and, more particularly, to an OLED with a doped emission layer.

BACKGROUND OF THE INVENTION

In general, an OLED is an emissive device and has been highlighted as the next generation display because it not only has a wide viewing angle and a good contrast but also a fast response time.

The OLED comprises an anode, a cathode and an emission layer (hereinafter, referred to as EML) interposed between the anode and the cathode. When a voltage is applied between the anode and the cathode, holes and electrons are injected into the EML, and then combined in the EML to create exitons, which decay radiatively. This radiation is called electroluminescence (EL)

The luminance property of the OLED may be determined in accordance with electroluminescent property of an organic material used for forming the EML. U.S. Pat. No. 4,769,292 discloses an OLED having a luminescent zone of less than 1 μmin thickness comprised of an organic host material and a light-emitting dopant. In this case, the light-emitting dopant may be a material that receives energy from the host material to create excitons, which are subject to transition from the excited state to the ground state to thereby emit light. The light-emitting dopant may act to adjust the color of the emitted light and improve the luminous efficiency of the OLED.

As such, when the EML is comprised of the host material and the dopant, the concentration of the dopant affects the driving voltage and the luminous efficiency of the OLED. The driving voltage may be reduced by increasing the concentration of the dopant. However, in this case, a concentration quenching phenomena may occur to thereby reduce the luminous efficiency. Thus, the dopant concentration needs to be adjusted to allow the driving voltage to be reduced and the luminous efficiency to be increased.

The excitons are created in the EML and remain in the excited state for a predetermined period of time and subject to transition to the ground state. The time taken for this procedure is referred to as the lifetime of the excitons. The excitons may be diffused into an interface between the EML and the anode or an interface between the EML and the cathode during the lifetime. Therefore, the excitons need to be confined within the EML to enhance the luminous efficiency of the OLED. This may be more necessary when using a phosphorus dopant having a long diffusion distance and excitons with a long lifetime.

U.S. Pat. No. 6,097,147 discloses a technique that can enhance the luminous efficiency by interposing a blocking layer between the EML and the cathode to confine the excitons within the EML. However, forming the blocking layer as a common layer on the red (R), the green (G) and the blue (B) EMLs in the process of fabricating a full color OLED, makes it difficult to adjust each of the luminous efficiencies of R, G, and B pixels.

SUMMARY OF THE INVENTION

The present invention provides an OLED having enhanced luminous efficiency and a reduced driving voltage by effectively confining excitons within an EML.

One of the OLED according to the present invention comprises a first electrode, a second electrode, and an EML having a host material and a light-emitting dopant. The EML is interposed between the first and the second electrodes, and the light-emitting dopant has a discontinuous concentration gradient between a first surface and a second surface. The first surface is close to the first electrode of the EML and the second surface is opposite to the first surface.

The OLED may further comprise a hole transporting layer (hereinafter, referred to as HTL) interposed between the first electrode and the EML, and an electron transporting layer (hereinafter, referred to as ETL) interposed between the EML and the second electrode. The OLED may further comprise a hole blocking layer (hereinafter, referred to as HBL) between the EML and the ETL.

In another OLED according to the present invention, the light-emitting dopant has a continuous concentration gradient between the first surface and the second surface. The first surface is close to the first electrode of the EML and the second surface is opposite to the first surface.

BRIEF DESCRIPTION OF THE DRAWINGS

The above and other features and advantages of the present invention will become more apparent to those of ordinary skill in the art by describing in detail preferred embodiments thereof with reference to the attached drawings.

DETAILED DESCRIPTION OF THE INVENTION

Figure 1:
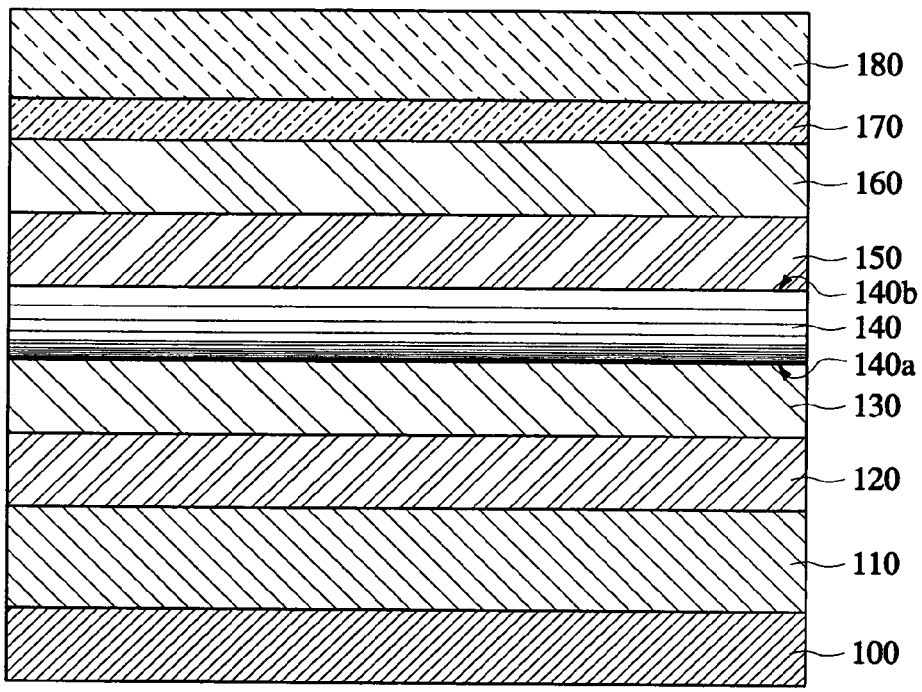
FIG. 1 shows a cross-sectional view for illustrating an OLED and a method for fabricating the same in accordance with an exemplary embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 shows a cross-sectional view for illustrating an OLED and a method for fabricating the same in accordance with an exemplary embodiment of the present invention. In addition, FIG. 2 shows a cross-sectional view for illustrating an OLED and method for fabricating the same in accordance with another exemplary embodiment of the present invention.

Figure 2:
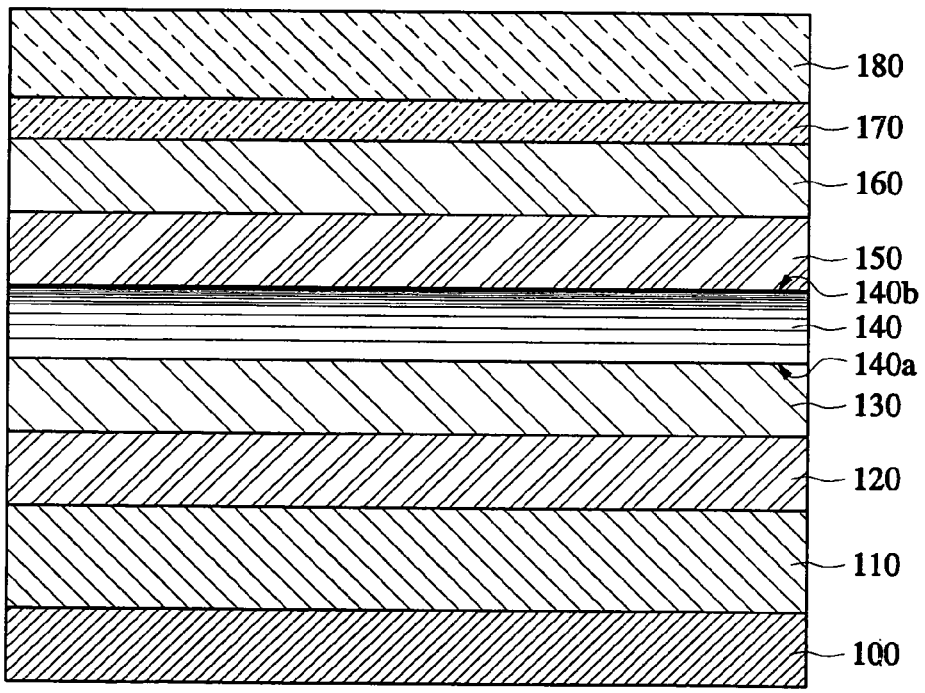
FIG. 2 shows a cross-sectional view for illustrating an OLED and a method for fabricating the same in accordance with another exemplary embodiment of the present invention.

Referring to FIG. 1 and FIG. 2, an anode 110 is formed on a substrate 100. The anode 110 may be formed as a transparent electrode or a reflecting electrode, and is formed using IZO (Indium Zinc Oxide), ITO (Indium Tin Oxide) or similar material when it is the transparent electrode, and is formed using Ag, Al, Ni, Pt, Pd, an alloy thereof or similar material when it is the reflecting electrode.

HTL 130 is formed on the anode 110. A hole injection layer (hereinafter, referred to as HIL) 120 may be formed on the anode 110 before the HTL 130 is formed. The HIL 120 may be one that facilitates hole injection into an EML to be formed in a subsequent process, and may be formed of non-polymer materials such as, but not limited to, copper phthalocyanine ("CuPc"), TNATA, TCTA, TDAPB and polymer materials such as, but not limited to, polyaniline ("PANI"), and PEDOT:PSS (where PEDOT is poly(3,4)-ethylenedioxythiophene). The HTL 130 may be formed of non-polymer materials such as, but not limited to, $N,N_i$®-bis-(1-naphthl)-$N,N_i^-$-diphenyl-1,1$_i^-$-biphenyl-4,4$_i^-$-diamine ("NPB"), TPD, s-TAD, and MTADATA and polymer materials such as, but not limited to, PVK, BFE, BFB, and TFB.

An EML 140 having a host material and a light-emitting dopant is formed on the HTL 130 such that the light-emitting dopant has a concentration gradient within the EML 140. The concentration gradient of the light-emitting dopant may be continuous or discontinuous. When the concentration gradient is discontinuous, the concentration of the light-emitting dopant may be made, for example, to be discontinuously changed every 10 Å to 300 Å in thickness of the EML 140.

The EML 140 having the concentration gradient of the light-emitting dopant is formed by codepositing the host material and the light-emitting dopant in a vacuum system. This process may be performed by controlling the deposition degree of the host material and the light-emitting dopant using a thickness monitor of the vacuum system. In order to implement a full color OLED, each of R, G, and B EMLs is vacuum deposited using a shadow mask, wherein the red, green, or blue EML may be formed to have a different concentration gradient from each other according to the property of the light-emitting dopant.

In contrast, the EML 140 also may be formed by a LITI method. In order to implement this, a donor film is required. The donor film comprises a base film and a transfer layer. In forcing the donor film, a light-to-heat conversion (hereinafter, referred to as LTHC) layer is formed on the base film, and then a transfer layer is formed on the LTHC layer. The transfer layer may be formed by codepositing the host material and the light-emitting dopant in the vacuum system such that the light-emitting dopant has a concentration gradient within the transfer layer. Once the donor film is prepared, it is disposed on the substrate 100 where the HTL 130 is already formed so as to have the transfer layer face the substrate 100. Then, a predetermined region of the donor film is irradiated with laser to transfer the transfer layer onto the substrate 100. As a result, the EML 140 on the HTL 130 is formed. In order to implement the full color OLED, each of the R, G, and B EMLs is formed by a LITI method, wherein the R, G, and/or B EML is formed to have a different concentration gradient from one another according to the property of the light-emitting dopant.

The light-emitting dopant may be a fluorescent or phosphorus one, wherein the fluorescent dopant may be DCJTB, 4-(Dicyanomethylene)-2-methyl-6-(p-dimethylaminostyryl)-4H-pyran ("DCM") or similar material, and the phosphorus dopant may be an organic metal complex that has one central metal selected from a group consisting of Ir, Pt, Th, Eu or similar material. The organic metal complex may be one selected from a group consisting of PtOEP, PQIr(acac), Btp2Ir(acac), Ir(ppy)3, FIrpic or similar material. The host material with respect to the fluorescent dopant may be tris(8-quinolinolato) aluminum ("Alq3") or similar material, and the host material with respect to the phosphorus dopant may be CBP, mCP or similar material.

The light-emitting dopant receives energy from the host material to form excitons, which are subject to transition to a ground state to thereby emit light when the OLED is driven. In the fluorescent dopant, the excitons of the singlet state transit to a ground state of a singlet state after radiation. So the lifetime of the excitons is short. However, in the phosphorus dopant, the radiative transition occurs to the ground state in excitons of a triplet state. In principle, it is not allowed and may occur emit light only when spin-orbit coupling is possible. The excitons of such phosphorus dopant have a long lifetime and a long diffusion distance.

The concentration gradient may be adjusted according to the property of the light-emitting dopant. As shown in FIG. 1, the concentration of the light-emitting dopant may be adjusted to be decreased from a surface close to the anode 110 of the EML, namely a first surface 140a, to a surface opposite to the first surface 140a, namely a second surface 140b. In this case, the concentration of the light-emitting dopant may be 50% by weight or less in the first surface 140a and may be 0% by weight or more in the second surface 140b. In contrast, as shown in FIG. 2, the concentration of the light-emitting dopant may be adjusted to be increased from the first surface 140a to the second surface 140b. In this case, the concentration of the light-emitting dopant may be 0% by weight or more in the first surface 140a and may be 50% by weight or less in the second surface 140b.

A factor in determining the concentration gradient of the light-emitting dopant is predicted to be the properties with respect to electron mobility or hole mobility of the light-emitting dopant. However, the present invention is not limited to such theory. Where a light-emitting dopant has a hole mobility higher than an electron mobility, excitons created therefrom are apt to diffuse to the second surface 140b when the OLED is driven. The excitons can be confined within the EML 140 by reducing the concentration at the second surface 140b and increasing the concentration at the first surface 140a. Where a light-emitting dopant has an electron mobility higher than a hole mobility, excitons created therefrom are apt to diffuse to the first surface 140a when the OLED is driven. The excitons can be confined within the EML 140 by reducing the concentration at the first surface 140a and increasing the concentration at the second surface 140b.

As a result, when the EML 140 is formed, the light-emitting dopant can be formed to have the concentration gradient within the EML 140 to facilitate confinement of the excitons within the EML, which leads to an improvement of the luminous efficiency of the OLED. In particular, in the case of excitons resulted from the phosphorus dopant, the excitons have a long lifetime and a long diffusion distance so that it is not easy to confine the excitons within the EML 140, however, the phosphorus dopant can be formed to have the concentration gradient within the EML 140 as mentioned above, which leads to the improvement of the luminous efficiency of the OLED.

An ETL 160 may be formed on the EML 140. In the phosphorus dopant as the light-emitting dopant, an HBL 150 may be formed on the EML 140 before the ETL 160 is formed. An electron injecting layer (hereinafter, referred to as EIL) 170 may be further formed on the ETL 160. The EIL 170 is one that facilitates electron injection into the EML 140, and may be formed using Alq3, Ga complex, PBD or similar material. The ETL 160 may be formed using polymer materials such as PBD, TAZ, spiro-PBD or similar material, and non-polymer materials such as Alq3, BAlq, SAlq (where Alq is (8-quinolinolato) aluminum or similar material. In addition, the HBL 150 may be formed using Balq, BCP, CF—X, TAZ, or spiro-TAZ or similar material.

An interface energy barrier between the EML 140 and the ETL 160 or the HBL 150 suppresses holes from flowing from the EML 140 to the HBL 150 or the ETL 160. An interface energy barrier between the HTL 130 and the EML 140 suppresses electrons from flowing from the EML 140 to the HTL 130. The formation of the HBL 150, the ETL 160, or the HTL 130 can facilitate improved confinement of the excitons within the EML 140.

A cathode 180 is formed on the EIL 170. The cathode 180 may be formed using Mg, Ca, Al, Ag, Ba, an alloy thereof or similar material, and may be thin enough to transmit light when it is a transparent electrode, and may be thicker when it is a reflecting electrode.

The OLED in accordance with various embodiments of the invention has a structure that the anode is positioned below the cathode. However the present invention is not limited to this example and can be implemented to have the OLED of a structure where the anode is positioned above the cathode.

Hereinafter, examples will be described to help understand the present invention. However, the present invention is not limited to the examples described below.

<FIRST EXAMPLE:

Ir(ppy)3 10 wt. %-7 wt. %-4 wt. % graded EML>

An ITO substrate patterned with a width of 80 μm was subject to an ultrasonic cleaning and UV-O₃ treatment, and a small-molecule type material of IDEMITZ 406 (available from IDEMITZ Co. and with a 5.1 eV of HOMO (Highest Occupied Molecular Orbital)) was then vacuum deposited with a thickness of 600 Å to form an HIL. A non-polymer material of IDEMITZ 320 (available from IDEMITZ Co. and with a 5.4 eV of HOMO) was then vacuum deposited with a thickness of 300 Å to form a HTL. A host material of CBP and Ir(ppy)3 was codeposited with a thickness of 80 Å on the HTL so as to have the concentration of Ir(ppy)3, which is a green phosphorus dopant, be 10% by weight, and CBP and Ir(ppy)3 was codeposited with a thickness of 80 Å so as to have the concentration of Ir(ppy)3 be 7% by weight, and CBP and Ir(ppy)3 was codeposited with a thickness of 80 Å so as to have the concentration of Ir(ppy)3 be 4% by weight, so that the EML having a total thickness of 240 Å was formed. Balq was deposited with a thickness of 50 Å on the EML to form a HBL, and Alq3 was deposited with a thickness of 200 Å on the HBL to form an ETL. LiF was then deposited with a thickness of 20 Å on the ETL to form an EIL, and Al was deposited with a thickness of 3000 Å on the EIL to form the a cathode. As a result, the OLED was completed.

<FIRST COMPARATIVE EXAMPLE

Ir(ppy)3 4 wt. %-7 wt. %-10 wt. % graded EML>

A host material of CBP and Ir(ppy)3 was codeposited with a thickness of 80 Å on the HTL so as to have the concentration of Ir(ppy)3 be 4% by weight, and CBP and Ir(ppy)3 was codeposited with a thickness of 80 Å so as to have the concentration of Ir(ppy)3 be 7% by weight. CBP and frppy)3 was codeposited with a thickness of 80 Å so as to have the concentration of Ir(ppy)3 be 10% by weight, so that an EML having a total thickness of 240 Å was formed. The same process as the first example, except the above procedure, was conducted to thereby complete an OLED.

<SECOND COMPARATIVE EXAMPLE

Ir(ppy)3 4 wt. % EML>

A host material of CBP and Ir(ppy)3 was codeposited to a thickness of 240 Å on the HTL with the Ir(ppy)3 concentration of 4% by weight, to form the EML. The same process as the first example, except the above procedure, was conducted to thereby complete an OLED.

<THIRD COMPARATIVE EXAMPLE

Ir(ppy)3 7 wt. % EML>

A host material of CBP and Ir(ppy)3 was codeposited to a thickness of 240 Å on the HTL with the Ir(ppy)3 concentration of 7% by weight, to form the EML. The same process as the first example, except the above procedure, was conducted to thereby complete an OLED.

<FOURTH COMPARATIVE EXAMPLE

Ir(ppy)3 10 wt. % EML>

A host material of CBP and Ir(ppy)3 was codeposited to a thickness of 240 Å on the HTL with the Ir(ppy)3 concentration of 10% by weight, to form the EML. The same process as the first example, except the above procedure, was conducted to thereby complete an OLED.

Figure 3:
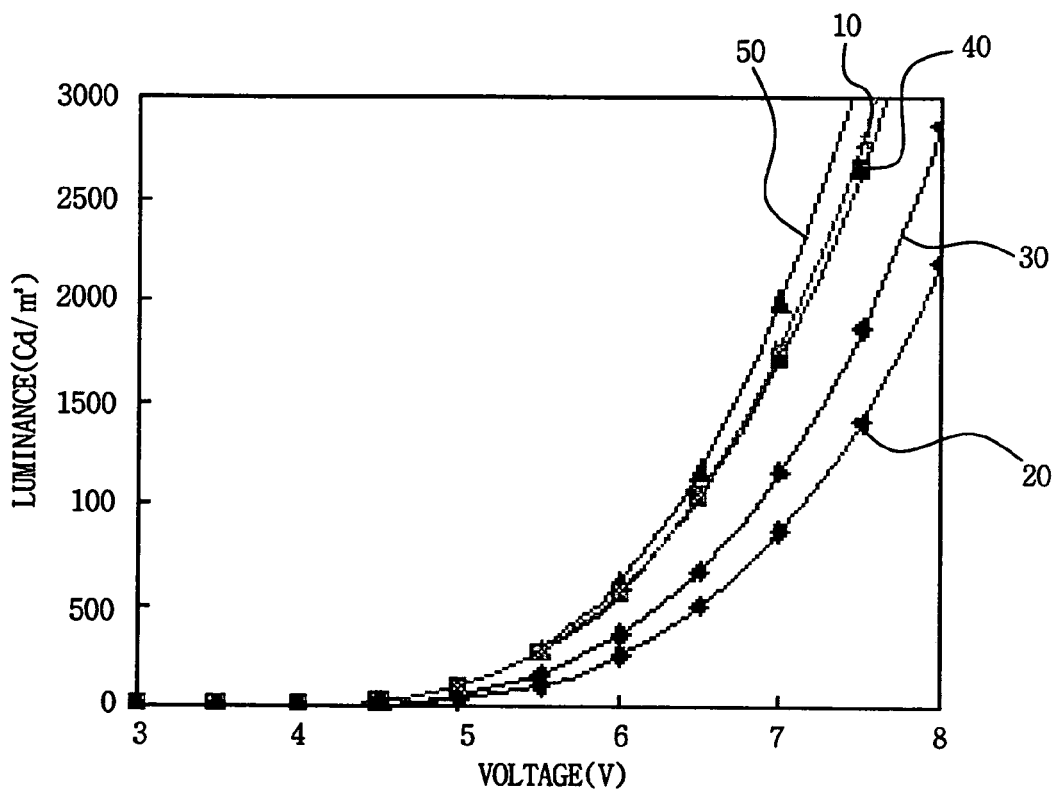
FIG. 3 shows a graph of voltage versus luminance of each of OLEDs fabricated by a first example, and first to fourth comparative examples.
Figure 4:
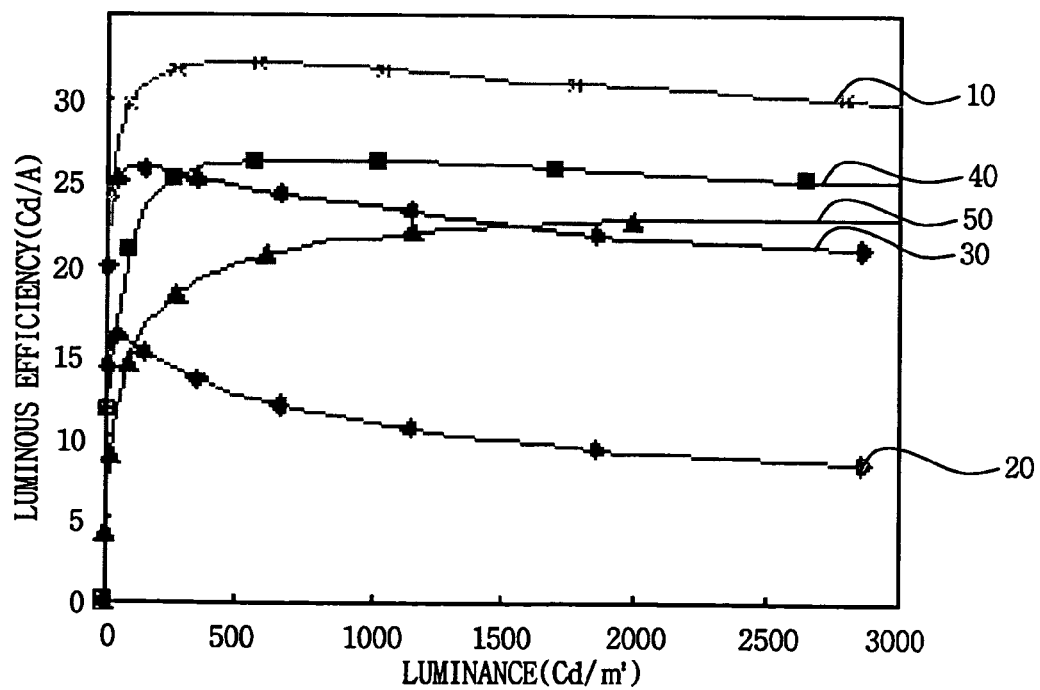
FIG. 4 shows a graph of luminance versus luminous efficiency of each of OLEDs fabricated by a first example, and first to fourth comparative examples.

FIG. 3 shows a graph of voltage versus luminance of each of the OLEDs fabricated by the first example, and the first to fourth comparative examples. FIG. 4 shows a graph of luminance versus luminous efficiency of each of the OLEDs fabricated by the first example, and the first to fourth comparative examples. In FIG. 3 and FIG. 4, numerical reference 10 represents the OLED in accordance with the first example, and numerical references 20, 30, 40 and 50 represent the OLEDs in accordance with the first to fourth comparative examples, respectively.

Referring to FIG. 3 and FIG. 4, when the concentration of the phosphorus dopant such as Ir(ppy)3 is constant within the EML (see 30, 40, 50 ), it can be seen that the more the concentration increases to have 4% by weight (30), 7% by weight (40), and 10% by weight (50), the more the luminance increases at the same voltage, and the driving voltage is reduced at 500 cd/m² (see FIG. 3). However, when the concentration reaches 10% by weight (50), concentration quenching occurs to cause a drastic reduction in the luminous efficiency (see FIG. 4). This means that it may not be desirable, in terms of the luminous efficiency, to constantly increase the concentration of the phosphorus dopant within the EML in order to reduce the driving voltage.

In contrast, when the concentration of the phosphorus dopant such as Ir(ppy)3 has a gradient within the EML (see 10, 20), it can be seen that the case (10) in accordance with the first example has the significantly improved luminous efficiency as well as the reduced driving voltage. But the case (20) in accordance with the second example has the worst luminous efficiency as well as the highest driving voltage. This means that the luminous efficiency of the OLED can be improved and the driving voltage can be reduced in a structure that the phosphorus dopant such as Ir(ppy)3 has the concentration gradient decreased from a first surface close to the anode of the EML to a second surface opposite to the first surface (i.e., 10% by weight –7% by weight –4% by weight) within the EML to thereby confine the excitons within the EML effectively.

<SECOND EXAMPLE

RD61 4%-8%-12% graded EML>

An ITO substrate patterned with a width of 80 μm was subject to an ultrasonic cleaning and UV-$O_3$ treatment, and non-polymer material of IDEMITZ 406 (available from IDEMITZ Co. and with a HOMO of 5.1 eV) was vacuum deposited with a thickness of 600 Å to form an HIL. A non-polymer material of IDEMITZ 320 (available from IDEMITZ Co. and with a 5.4 eV of HOMO) was then vacuum deposited with a thickness of 300 Å to form an HTL. A host material of CBP and RD61 (Iridium (III)bis (1-phenyl(quinolinato-N,C2'))acetylacetonate, available from UDC Co.) was codeposited with a thickness of 100 Å on the HTL so as to have the concentration of RD61, which is a red phosphorus dopant, be 4% by weight, and CBP and RD61 was codeposited with a thickness of 100 Å so as to have the concentration of RD61 be 8% by weight. CBP and RD61 was codeposited with a thickness of 100 Å so as to have the concentration of RD61 be 12% by weight, so that a EML having a total thickness of 300 Å was formed. Balq was deposited with a thickness of 50 Å on the EML to form an HBL, and Alq3 was deposited with a thickness of 200 Å on the HBL to form an ETL. LiF was then deposited with a thickness of 20 Å on the ETL to form an EIL, and Al was deposited with a thickness of 3000 Å on the EIL to form a cathode. As a result, the OLED was completed.

<FIFTH COMPARATIVE EXAMPLE

RD61 12 wt. %-8 wt. %-4 wt. % graded EML>

A host material of CBP and RD61 was codeposited with a thickness of 100 Å on the HTL so as to have the concentration of RD61 be 12% by weight. CBP and RD61 were codeposited with a thickness of 100 Å so as to have the concentration of RD61 be 8% by weight. CBP and RD61 were codeposited with a thickness of 100 Å so as to have the concentration of RD61 be 4% by weight, so that an EML having a total thickness of 300 Å was formed. The same process as the second example except the above procedure was conducted to thereby complete the OLED.

<SIXTH COMPARATIVE EXAMPLE

RD61 12 wt. % EML>

A host material of CBP and RD61 was codeposited with a thickness of 300 Å on the HTL so as to have the concentration of RD61 be 12% by weight, so that an EML was formed. The same process as the second example except the above procedure was conducted to thereby complete the OLED.

Luminous efficiency properties of the completed OLED are shown in Table 1 below in accordance with the second example, and the fifth and sixth comparative examples.

TABLE 1

|  | Reference voltage (V) | Luminous efficiency (cd/A) |
| --- | --- | --- |
| Second example | 5.5 | 15.5 |
| Fifth comparative example | 5.5 | 13.2 |
| Sixth comparative example | 5.5 | 13.4 |

Referring to the Table 1, RD61 as the red phosphorus dopant is formed to have a concentration gradient within the EML such that the concentration is increased from a first surface close to the anode of the EML to a second surface opposite to the first surface (see the second example), so that the luminous efficiency is shown to be improved over the fifth and sixth comparative example.

In addition, EMLs having concentration gradients may be formed to be compatible with the light-emitting dopant of each of the R, G, and B color when implementing a full color OLED, so that the HTL, the HBL, and/or the ETL can be formed in common above and below the EMLs. Luminous efficiency of each color of the OLEDs can be easily adjusted at the same time.

As mentioned above, the EML having a concentration gradient of the light-emitting dopant is formed to confine excitons within the EML when the OLED is driven in accordance with the present invention. The luminous efficiency of the OLED can be improved and the driving voltage can be reduced at the same time. In addition, the luminous efficiency of each color of the OLEDs may be easily adjusted when implementing the full color OLED.

While the present invention has been described with reference to particular embodiments, it is understood that the disclosure has been made for purpose of illustrating the invention by way of examples and does not limit the scope of the invention. It is further recognized that one skilled in the art can amend and change the present invention without departing from the scope and spirit of the invention.

What is claimed is:

1. An organic light-emitting device comprising:
   a first electrode;
   a second electrode; and
   an emission layer having a host material and a light-emitting dopant interposed between the first electrode and the second electrode, where the emission layer has a first surface and a second surface opposite to the first surface,
   wherein the light-emitting dopant has a continuous concentration gradient between the first surface and the second surface; and
   wherein the light-emitting dopant is a phosphorous dopant.

2. The organic light-emitting device of claim 1, wherein the emission layer is formed by a laser induced thermal imaging method.

3. The organic light-emitting device of claim 1, wherein the concentration of the light-emitting dopant decreases from the first surface to the second surface.

4. The organic light-emitting device of claim 3, wherein the concentration of the light-emitting dopant is 50% by weight or less in the first surface and 0% by weight or more in the second surface.

5. The organic light-emitting device of claim 1, wherein the concentration of the light-emitting dopant increases from the first surface to the second surface.

6. The organic light-emitting device of claim 5, wherein the concentration of the light-emitting dopant is 0% by weight or more in the first surface and 50% by weight or less in the second surface.

7. The organic light-emitting device of claim 1, wherein the phosphorus dopant is any one selected from a group consisting of PtOEP, PQIr(acac), $Btp_2Ir(acac)$, $Ir(ppy)_3$, RD61 and Flrpic.

8. The organic light-emitting device of claim 7, wherein the host material is any one of CBP and mCP.

9. The organic light-emitting device of claim 1, further comprising: when one of the first electrode and the second electrode is an anode and the other is a cathode, a hole transporting layer interposed between the anode and the emission layer; and an electron transporting layer interposed between the emission layer and the cathode.

10. The organic light-emitting device of claim 9, further comprising a hole blocking layer between the emission layer and the electron transporting layer.

11. The organic light-emitting device of claim 10, where the host material is doped with at least one of $Ir(ppy)_3$, RD61, PtOEP, PQIr(acac), $Btp_2Ir(acac)$, Flrpic and substantially similar material.

12. The organic light-emitting device of claim 1, wherein the emission layer is formed by codepositing the host material and the light-emitting dopant.

13. The organic light-emitting device of claim 1, wherein the emission layer is formed by a laser induced thermal imaging method.

* * * * *